(12) United States Patent
Yoon et al.

(10) Patent No.: US 11,348,654 B2
(45) Date of Patent: May 31, 2022

(54) MEMORY DEVICE AND METHOD FOR REDUCING BAD BLOCK TEST TIME

(71) Applicant: SAMSUNG ELECTRONICS CO., LTD., Suwon-si (KR)

(72) Inventors: Myoung-Won Yoon, Suwon-si (KR); Sang-Hyun Joo, Suwon-si (KR)

(73) Assignee: Samsung Electronics Co., Ltd., Suwon-si (KR)

(*) Notice: Subject to any disclaimer, the term of this patent is extended or adjusted under 35 U.S.C. 154(b) by 87 days.

(21) Appl. No.: 17/010,238

(22) Filed: Sep. 2, 2020

(65) Prior Publication Data

US 2021/0272645 A1 Sep. 2, 2021

(30) Foreign Application Priority Data

Mar. 2, 2020 (KR) .................. 10-2020-0026038

(51) Int. Cl.
*G11C 29/14* (2006.01)
*G11C 16/08* (2006.01)
*G11C 16/04* (2006.01)
*G11C 29/38* (2006.01)
*G11C 7/22* (2006.01)

(52) U.S. Cl.
CPC .............. *G11C 29/14* (2013.01); *G11C 7/22* (2013.01); *G11C 16/0483* (2013.01); *G11C 16/08* (2013.01); *G11C 29/38* (2013.01)

(58) Field of Classification Search
CPC ....... G11C 7/22; G11C 29/14; G11C 16/0483; G11C 16/08; G11C 29/38; G11C 2029/4402; G11C 29/1201; G11C 29/16; G11C 29/4401; G11C 29/46; G11C 29/765; G11C 29/804; G11C 29/56; G11C 16/10; G11C 2029/0411; G11C 2029/5602

See application file for complete search history.

(56) References Cited

U.S. PATENT DOCUMENTS

| | | | |
|---|---|---|---|
| 5,848,009 | A | 12/1998 | Lee et al. |
| 6,288,940 | B1 | 9/2001 | Kawamura |
| 7,679,133 | B2 | 3/2010 | Son et al. |
| 7,768,831 | B2 | 8/2010 | Byeon et al. |

(Continued)

FOREIGN PATENT DOCUMENTS

| | | |
|---|---|---|
| KR | 1020120036728 A | 4/2012 |
| KR | 1020140134096 A | 11/2014 |

*Primary Examiner* — Steve N Nguyen
(74) *Attorney, Agent, or Firm* — Volentine, Whitt & Francos, PLLC

(57) ABSTRACT

A test system includes a non-volatile memory device that includes a plurality of memory blocks operating in a multi-plane mode, and a test machine that detects a bad block of the non-volatile memory device. The non-volatile memory device generates a ready/busy signal which is based on whether an erase loop for detection of the bad block progresses. When at least one normal block is detected from the plurality of memory blocks included in planes operating in the multi-plane mode, the non-volatile memory device generates the ready/busy signal having a first busy interval. When all the memory blocks included in the planes operating in the multi-plane mode are detected as bad blocks, the non-volatile memory device generates the ready/busy signal having a second busy interval shorter than the first busy interval.

20 Claims, 22 Drawing Sheets

(56) References Cited

U.S. PATENT DOCUMENTS

| | | | |
|---|---|---|---|
| 8,553,466 B2 | 10/2013 | Han et al. | |
| 8,559,235 B2 | 10/2013 | Yoon et al. | |
| 8,654,587 B2 | 2/2014 | Yoon et al. | |
| 10,424,352 B2 * | 9/2019 | Kim | G11C 7/22 |
| 2003/0204797 A1 * | 10/2003 | Lin | G11C 29/48 |
| | | | 714/718 |
| 2006/0221729 A1 * | 10/2006 | Iwai | G11C 29/44 |
| | | | 365/200 |
| 2008/0266956 A1 * | 10/2008 | Byeon | G11C 8/12 |
| | | | 365/185.09 |
| 2009/0207663 A1 * | 8/2009 | Kang | G11C 7/1051 |
| | | | 365/185.18 |
| 2010/0034037 A1 * | 2/2010 | Tabata | G11C 29/56 |
| | | | 365/201 |
| 2011/0063909 A1 * | 3/2011 | Komatsu | G11C 29/28 |
| | | | 365/185.09 |
| 2011/0233648 A1 | 9/2011 | Seol et al. | |
| 2012/0036369 A1 * | 2/2012 | Chang | G11C 16/22 |
| | | | 713/189 |
| 2012/0257455 A1 * | 10/2012 | Oh | G11C 16/0483 |
| | | | 365/185.22 |
| 2017/0140828 A1 * | 5/2017 | Jung | G11C 29/028 |

* cited by examiner

| | | | |
|---|---|---|---|
| Free BLK | Free BLK | Free BLK | Free BLK |
| BLK16 | BLK17 | BLK18 | BLK19 |
| Free BLK | Free BLK | Free BLK | Free BLK |
| BLK12 | BLK13 | BLK14 | BLK15 |
| Valid BLK | Valid BLK | Valid BLK | Valid BLK |
| BLK8 | BLK9 | BLK10 | BLK11 |
| Valid BLK | Valid BLK | Valid BLK | Valid BLK |
| BLK4 | BLK5 | BLK6 | BLK7 |
| Valid BLK | Valid BLK | Valid BLK | Valid BLK |
| BLK0 | BLK1 | BLK2 | BLK3 |
| PLN#0 | PLN#1 | PLN#2 | PLN#3 |

MEMORY DEVICE AND METHOD FOR REDUCING BAD BLOCK TEST TIME

CROSS-REFERENCE TO RELATED APPLICATIONS

This U.S. nonprovisional patent application claims priority under 35 U.S.C. § 119 to Korean Patent Application No. 10-2020-0026038, filed on Mar. 3, 2020 in the Korean Intellectual Property Office, the disclosure of which is incorporated by reference herein in its entirety.

BACKGROUND

1. Technical Field

The inventive concept(s) described herein relate to a semiconductor memory, and more particularly, relate to a test system for reducing a time taken to detect a bad block and a test method thereof.

2. Description of the Related Art

A semiconductor memory device is a storage device capable of storing data and reading the stored data if necessary. The semiconductor memory device may be mainly classified as a volatile memory device or a non-volatile memory device. Data stored in the volatile memory device disappears when power is turned off. Data stored in the non-volatile memory device is retained even when power is turned off. The non-volatile memory device includes a mask read-only memory (MROM), a programmable ROM (PROM), an erasable programmable ROM (EPROM), an electrically erasable programmable ROM (EEPROM), etc.

In general, data cannot be freely written in and erased from the MROM, the PROM, and the EPROM, and resultingly, it is difficult for users to update information stored therein. In contrast, data can be electrically written to and erased from the EEPROM. Resultingly, demand for EEPROM is increasing, particularly for system programming and auxiliary storage devices that need to update stored information. In more detail, a flash EEPROM is more highly integrated than a conventional EEPROM. Resultingly, it is advantageous to apply the flash EEPROM rather than a conventional EEPROM to a high-capacity auxiliary storage device. Among flash EEPROMs, a NAND-type flash EEPROM (hereinafter referred to as a "NAND flash memory") may be more highly integrated than any other flash EEPROM(s). Also, the NAND flash memory may have a high capacity and excellent write performance and erase performance.

Access to the NAND flash memory is performed in units of a block. A block may be a "bad block" when the block includes a bad bit, so that a bad block of NAND flash memory is caused by even one bad bit because the access to the NAND flash memory is performed in units of a block. When data is written in the bad block, various errors such as a read error, a write error, and an erase error may occur. Moreover, even though the read, write, or erase operation is normally performed, data stored in the bad block may be altered. Accordingly, the NAND flash memory may perform a test to detect a bad block for the purpose of ensuring the bad block does not cause an error.

SUMMARY

Embodiments of the present disclosure provide a test system for reducing a time taken to detect a bad block and a test method thereof.

According to an exemplary embodiment, a test system includes a non-volatile memory device that includes a plurality of memory blocks operating in a multi-plane mode, and a test machine that detects a bad block of the non-volatile memory device. The non-volatile memory device generates a ready/busy signal which is based on whether an erase loop for detection of the bad block progresses. When at least one normal block is detected from a plurality of blocks included in planes operating in the multi-plane mode, the non-volatile memory device generates the ready/busy signal having a first busy interval. When all the blocks included in the planes operating in the multi-plane mode are detected as bad blocks, the non-volatile memory device generates the ready/busy signal having a second busy interval shorter than the first busy interval.

According to an exemplary embodiment, a non-volatile memory device includes a plurality of memory blocks operating in a multi-plane mode. A bad block detection method of the non-volatile memory device includes receiving, at the non-volatile memory device, a command signal from an outside and receiving, at the non-volatile memory device, an address signal from the outside. The bad block detection method also includes receiving, at the non-volatile memory device, a confirm command signal from the outside and detecting, at the non-volatile memory device, a bad block based on address information included in the address signal. The bad block detection method further includes generating, at the non-volatile memory device, a ready/busy signal which is based on whether an erase loop for detection of the bad block progresses. When at least one normal block is detected from a plurality of blocks included in planes operating in the multi-plane mode, the non-volatile memory device generates the ready/busy signal having a first busy interval. When all the blocks included in the planes operating in the multi-plane mode are detected as bad blocks, the non-volatile memory device generates the ready/busy signal having a second busy interval shorter than the first busy interval.

According to an exemplary embodiment, a non-volatile memory device includes a plurality of memory blocks operating in a multi-plane mode. A bad block detection method of the non-volatile memory device includes inputting, at a test machine, a command signal to the non-volatile memory device and inputting, at the test machine, an address signal for selecting a memory block to the non-volatile memory device. The bad block detection method also includes inputting, at the test machine, a confirm command signal to the non-volatile memory device, and receiving, at the test machine, a ready/busy signal which is based on whether an erase loop for detection of the bad block progresses. When the ready/busy signal having a first busy interval is received, the test machine determines at least one of the plurality of memory blocks included in planes operating in the multi-plane mode as a normal block. When the ready/busy signal having a second busy interval shorter than the first busy interval is received, the test machine determines all the memory blocks included in the planes operating in the multi-plane mode as bad blocks.

BRIEF DESCRIPTION OF THE FIGURES

The above and other objects and features of the inventive concept(s) described herein will become apparent by describing in detail exemplary embodiments of the present disclosure with reference to the accompanying drawings.

FIG. 13A is a diagram illustrating an operation in the case where a bad block does not occur in a four-plane mode, according to another embodiment of the present disclosure.

DETAILED DESCRIPTION

Figure 1:
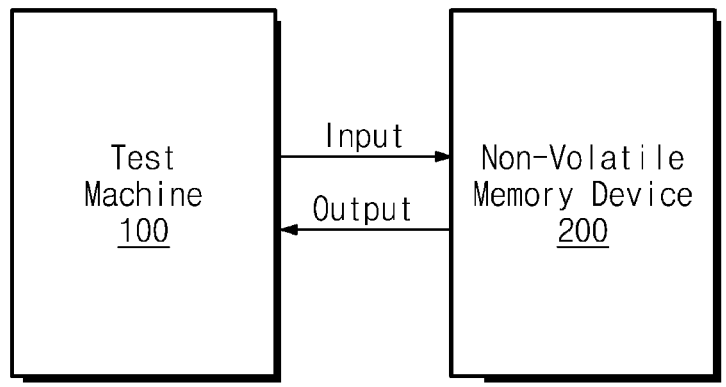
FIG. 1 is a block diagram illustrating a test system according to an embodiment of the present disclosure.

Below, embodiments of the present disclosure may be described in detail and clearly to such an extent that an ordinary one in the art easily implements the inventive concept(s) described herein.

The terms used in the specification are provided to describe the embodiments, not to limit aspects of the inventive concept(s) described herein. As used in the specification, the singular terms "a," "an" and "the" are intended to include the plural forms as well, unless the context clearly indicates otherwise. The terms "comprises" and/or "comprising," when used in the specification, specify the presence of steps, operations, elements, and/or components, but do not preclude the presence or addition of one or more other steps, operations, elements, components, and/or groups thereof.

Unless otherwise defined, all terms (including technical and scientific terms) used in the specification should have the same meaning as commonly understood by those skilled in the art(s) to which the inventive concept(s) described herein pertain. The terms, such as those defined in commonly used dictionaries, should not be interpreted in an idealized or overly formal sense unless expressly so defined herein. The same reference numerals represent the same elements throughout the specification.

FIG. 1 is a block diagram illustrating a test system according to an embodiment of the present disclosure.

Referring to FIG. 1, the test system may include a test machine 100 and a non-volatile memory device 200.

The test machine 100 may include a memory that stores instructions and a processor that executes the instructions to execute one or more functions attributed to the test machine 100 herein. Alternatively or additionally, the test machine 100 may include circuitry such as an application specific integrated circuit (ASIC) to implement one or more functions attributed to the test machine 100 herein.

The test machine 100 may detect a bad block of the non-volatile memory device 200. The test machine 100 may output an input signal Input to the non-volatile memory device 200. The input signal Input may include an erase command for detecting a bad block. The test machine 100 may receive an output signal Output generated from the non-volatile memory device 200. The output signal Output may include a ready/busy signal R/B indicating a block state.

The non-volatile memory device 200 may include a NAND flash memory. For example, the non-volatile memory device 200 may operate in a two-plane mode. In a two-plane mode, blocks may be arranged in each of two planes, and one block from each plane may be processed together. The non-volatile memory device 200 may include a plurality of memory blocks as a NAND flash memory operating in a two-plane mode. Each of the memory blocks may include a plurality of pages. For NAND flash memory, two-plane mode may involve operations such as a read operation or a write operation being performed simultaneously on memory blocks in two different pages. Each of the pages may include a plurality of memory cells. Each memory cell may store one data bit or two or more data bits. For NAND flash memory, two-plane mode may involve operations such as a read operation or a write operation being performed simultaneously on memory blocks in two different pages.

The test machine 100 may detect a bad block of the non-volatile memory device 200, based on the ready/busy signal R/B generated from the non-volatile memory device

200. Whether a bad block is detected may be determined based on a busy interval length of the ready/busy signal R/B. According to an aspect of the present disclosure, in the case where at least one but fewer than all of multiple blocks belonging to two planes operating in the two-plane mode are detected as a normal block, the ready/busy signal R/B may have a first busy interval. In contrast, in the case where all blocks belonging to two planes operating in the two-plane mode are detected as a bad block, the ready/busy signal R/B may have a second busy interval that is shorter than the first busy interval.

A bad block erase loop is for detection of a bad block, and may be referred to herein as an erase loop. A bad block erase loop consists of a block selection interval, an erase execution interval, a recovery interval, and a read verification interval. But, when a bad block is detected, the erase loop may not proceed to the end of the erase loop. For example, detection of the bad block may result in one or more of the block selection interval, the erase execution interval, the recovery interval and the read verification interval being skipped. Accordingly, in the case where all blocks belonging to two planes operating in the two-plane mode are detected as bad blocks, the test system may check only whether a bad block occurs without executing an erase loop to the full extent for each of the detected bad blocks. That is, the erase loop may not be executed up to a maximum value or full extent. The test system may reduce a time loss according to the progress of a bad block erase loop by executing the erase loop only through checking whether a bad block occurs. Therefore, the full potential extent of processing that is otherwise performed is not performed once a determination is made that a block is a bad block, and this reduces the overall time lost for processing the bad block erase loop.

Figure 2:
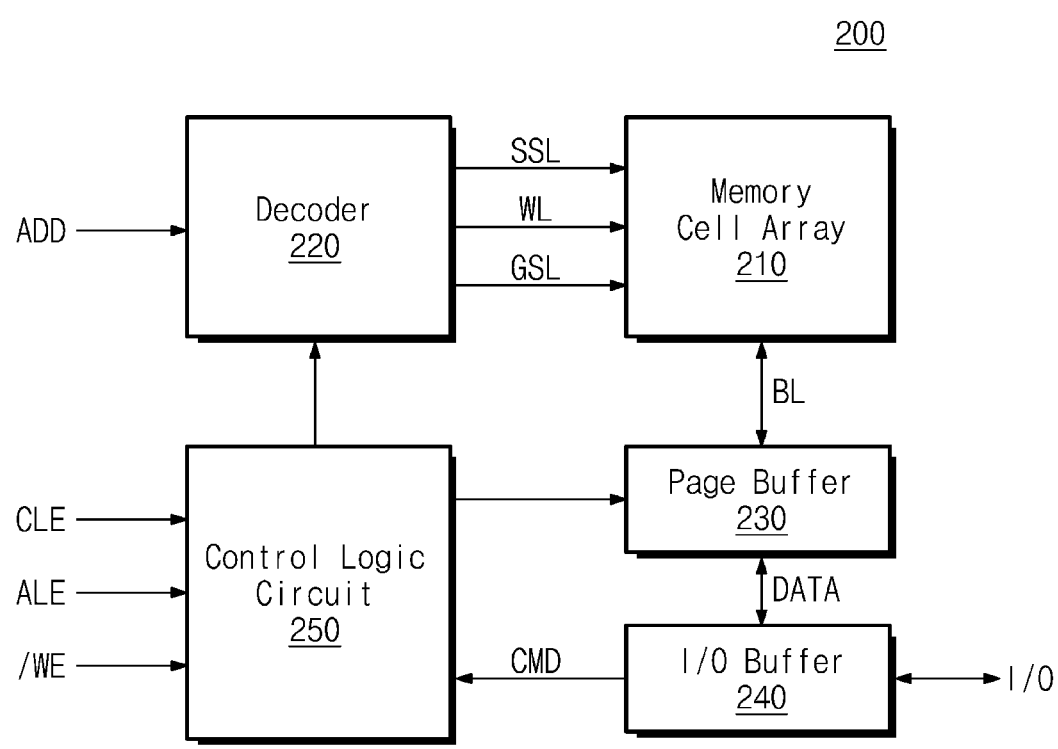
FIG. 2 is a block diagram illustrating a configuration of a non-volatile memory device of FIG. 1.

FIG. 2 is a block diagram illustrating a configuration of a non-volatile memory device of FIG. 1.

Referring to FIG. 2, the non-volatile memory device 200 may include a memory cell array 210, a decoder 220, a page buffer 230, an input/output buffer 240, and a control logic circuit 250.

The memory cell array 210 may be connected with the decoder 220 through word lines WL and selection lines SSL (string selection line) and GSL (ground selection line). The memory cell array 210 may be connected to the page buffer 230 through bit lines BL. The memory cell array 210 may include a plurality of memory blocks. Each of the memory blocks may include a plurality of NAND cell strings. A structure of a memory block included in the memory cell array 210 will be more fully described with reference to FIG. 6 below.

The decoder 220 may select one of the memory blocks of the memory cell array 210 in response to an address signal ADD. The decoder 220 may provide a word line voltage corresponding to an operating mode to a word line of a selected memory block. Also, the decoder 220 may provide selection signals to the selection lines SSL and GSL to select a memory block.

The page buffer 230 may operate as a write driver or a sense amplifier depending on an operating mode. In a program operation, the page buffer 230 may supply a bit line voltage corresponding to data to be programmed to a selected bit line BL associated with the memory cell array 210. In a read operation, the page buffer 230 may sense data stored in a selected memory cell through a bit line BL. The page buffer 230 may latch the sensed data and may output the latched data to the outside.

In the program operation, the input/output buffer 240 may transfer a write data signal DATA to the page buffer 230. In the read operation, the input/output buffer 240 may output a read data signal DATA provided from the page buffer 230 to the outside. The input/output buffer 240 may transfer a command signal CMD and the address signal ADD received from the outside to the control logic circuit 250 or the decoder 220.

The control logic circuit 250 may control the decoder 220 and the page buffer 230 in response to the command signal CMD, a command latch enable signal CLE, an address latch enable signal ALE, or a write enable signal /WE. The control logic circuit 250 may allow the decoder 220 to generate biases in various different schemes depending on a program command. In particular, the control logic circuit 250 may output information about a program result depending on a request.

Figure 3:
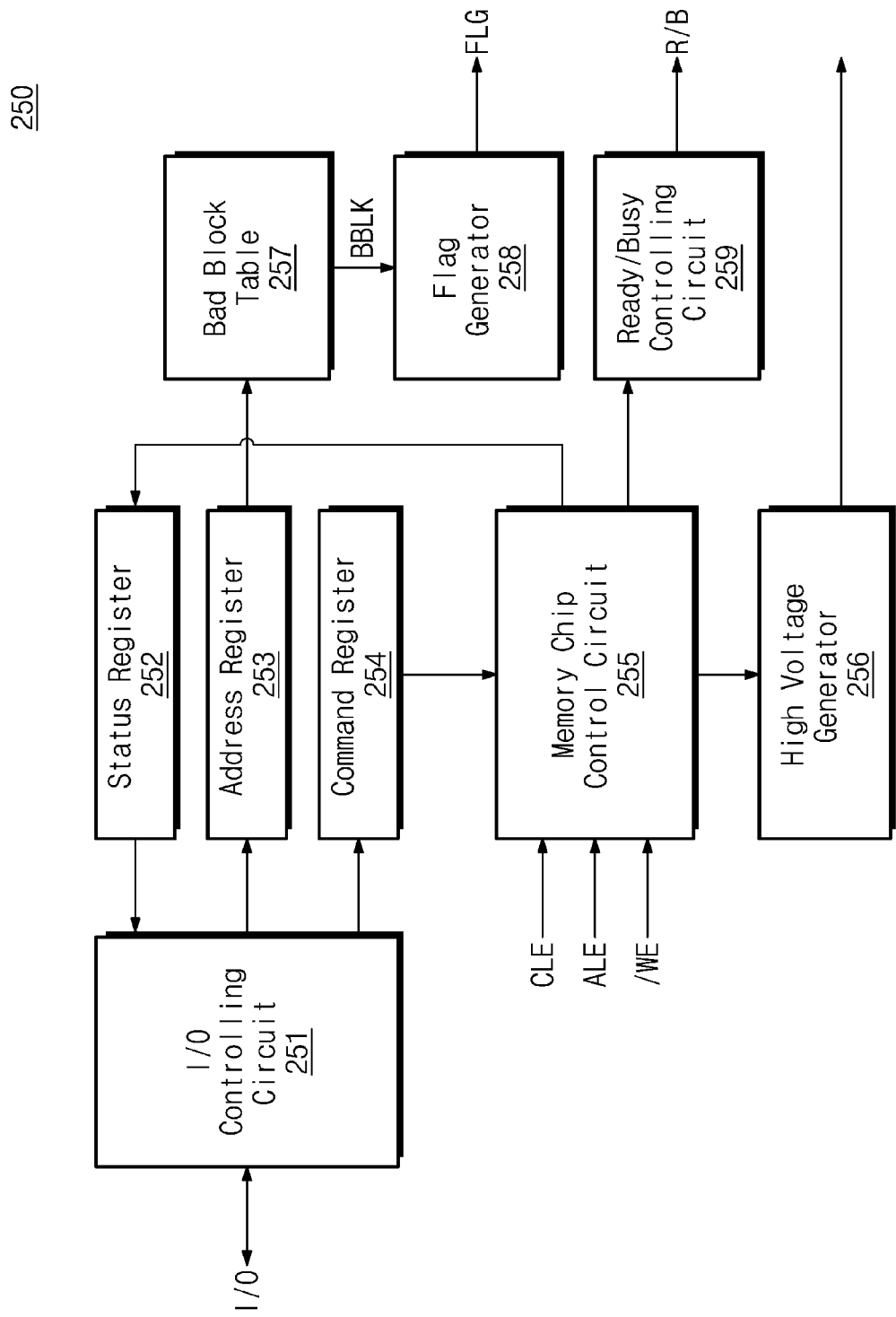
FIG. 3 is a block diagram illustrating a configuration of a control logic circuit of FIG. 2.

FIG. 3 is a block diagram illustrating a configuration of a control logic circuit of FIG. 2.

Referring to FIG. 3, the control logic circuit 250 may include an I/O controlling circuit 251, a status register 252, an address register 253, a command register 254, a memory chip control circuit 255, a high voltage generator 256, a bad block table 257, a flag generator 258, and a ready/busy controlling circuit 259.

The I/O controlling circuit 251 may receive signals necessary for an operation of the non-volatile memory device 200 (refer to FIG. 1) from the outside. For example, the signals that the I/O controlling circuit 251 receives may include the command signal CMD, the address signal ADD, or the data signal DATA. Also, the I/O controlling circuit 251 may inform the outside of the status of the non-volatile memory device 200.

The status register 252 may receive a signal from the memory chip control circuit 255 and may output the received signal to the I/O controlling circuit 251. The address register 253 may receive the address signal ADD from the I/O controlling circuit 251 and may output the received signal to the bad block table 257. The command register 254 may receive the command signal CMD from the I/O controlling circuit 251 and may output the received signal to the memory chip control circuit 255.

The memory chip control circuit 255 may receive signals provided from the outside. For example, the signals provided from the outside may include the command latch enable signal CLE, the address latch enable signal ALE, and the write latch enable signal /WE. The memory chip control circuit 255 may control a memory chip depending on the signals provided from the outside. Also, the memory chip control circuit 255 may output a control signal(s) to the high voltage generator 256 and the ready/busy controlling circuit 259.

The high voltage generator 256 may receive the control signal from the memory chip control circuit 255. The high voltage generator 256 may generate a high voltage based on the received control signal. The high voltage generated by the high voltage generator 256 may be output to the memory chip. A level of the high voltage that is generated by the high voltage generator 256 during a busy time interval necessary for a bad block detection test may be uniform or substantially uniform, such as by consistently being within a range varying within, e.g., a 2% or 5% range.

The bad block table 257 may receive the address signal ADD output from the address register 253. The bad block table 257 may store bad block information of a memory device. The bad block table 257 may read bad block information corresponding to the received address signal ADD. The bad block table 257 may output a bad block flag signal BBLK when a result of comparing the bad block information of the bad block table 257 and the address signal ADD indicates a bad block.

The flag generator 258 may receive the bad block flag signal BBLK generated by the bad block table 257. The flag generator 258 may generate a flag signal FLG indicating bad block information of the memory chip based on the bad block flag signal BBLK. The flag generator 258 may output the flag signal FLG to the outside through a flag terminal.

The ready/busy controlling circuit 259 may output the ready/busy signal R/B indicating a ready state or busy state of the memory chip. The ready/busy controlling circuit 259 may include an NMOS transistor having a source grounded and a drain connected with a ready/busy terminal. A gate of the NMOS transistor may be controlled by the memory chip control circuit 255. The ready/busy controlling circuit 259 may generate the ready/busy signal R/B based on a bad block detection result of the non-volatile memory device 200.

Figure 4:
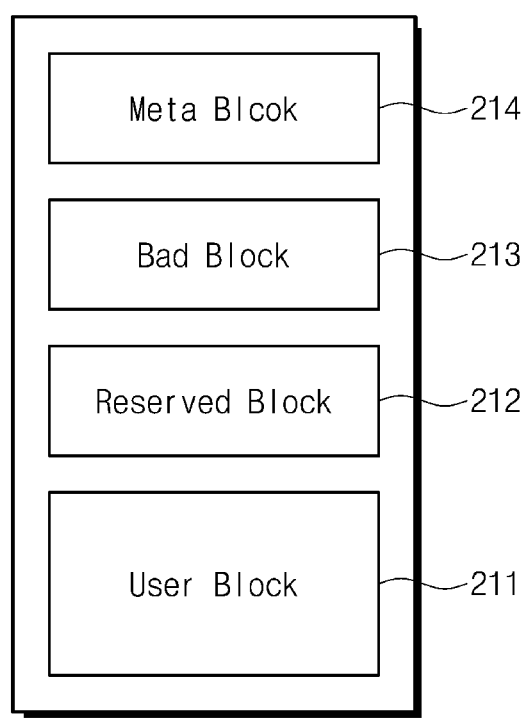
FIG. 4 is a block diagram illustrating a configuration of a memory cell array of FIG. 2.

FIG. 4 is a block diagram illustrating a configuration of a memory cell array of FIG. 2.

Referring to FIG. 4, a memory cell array 210a according to an embodiment of the present disclosure may include a user block 211, a reserved block 212, a bad block 213, and a meta block 214.

Data input from the outside may be written in the user block 211. The user block 211 may be representative of multiple user blocks in the memory cell array 210a, and the reserved block 212 may be representative of multiple reserved blocks in the memory cell array 210a. When the user block 211 satisfies a bad block condition, the reserved block 212 may be used to replace the user block 211. In other words, when the user block 211 is detected as a bad block, the reserved block 212 may be allocated to be a memory block usable as a user block 211 instead of the detected bad block. An example is illustrated in FIG. 4 as the memory cell array 210a includes one user block 211 and one reserved block 212, but the memory cell array 210a may include a plurality of user blocks and a plurality of reserved blocks.

The bad block 213 that is an unusable memory block may include an initial bad block determined as a bad block in a manufacturing process or a run-time bad block determined as a bad block from operations occurring in use. In the case where a memory block satisfies the bad block condition, the corresponding memory block may be designated as a bad block. The bad block condition may include a program/erase cycle count or failure of an erase operation. For example, when an erase count of a memory block exceeds a given count, the corresponding memory block may be detected as a bad block. Also, when an erase operation of a memory block fails, the corresponding memory block may be detected as a bad block.

The meta block 214 may store management information for managing the non-volatile memory device 200 (refer to FIG. 1). For example, the management information may include allocation information about user blocks, reserved blocks, and bad blocks. The block allocation information may include information about mapping between a logical address and a physical address for each of the user blocks, the reserved blocks and the bad blocks. Also, the management information may include information about a program/erase cycle count of each of memory blocks included in the user block 211.

Figure 5:
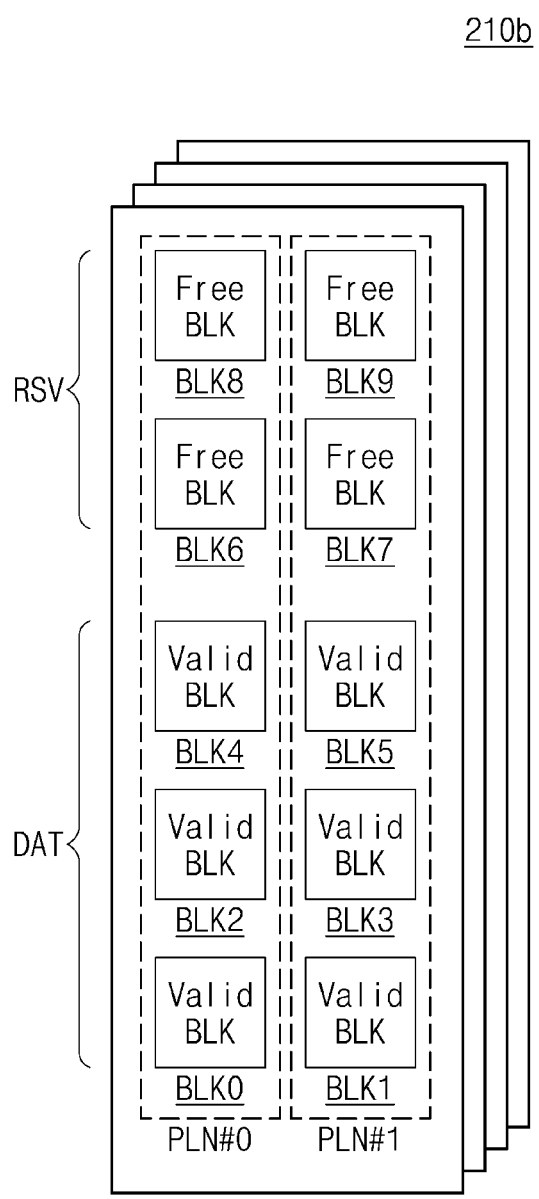
FIG. 5 is a block diagram illustrating another configuration of a memory cell array of FIG. 2.

FIG. 5 is a block diagram illustrating another configuration of a memory cell array of FIG. 2.

Referring to FIG. 5, a memory cell array 210b according to another embodiment of the present disclosure may include a plurality of memory chips. Each of the memory chips may include two planes PLN#0 and PLN#1. Each of the planes PLN#0 and PLN#1 may include a data area DAT and a reserved area RSV.

The data area DAT may be used to store user data. The reserved area RSV may include one or more reserved blocks that can be used to replace a bad block. In an embodiment of the present disclosure, the data area DAT may include six blocks BLK0, BLK1, BLK2, BLK3, BLK4, and BLK5. The reserved area RSV may include four blocks BLK6, BLK7, BLK8, and BLK9. However, the inventive concept(s) described herein are not limited by the above configuration. For example, the number of blocks included in the data area DAT and the number of blocks included in the reserved area RSV may be variously changed.

Figure 6:
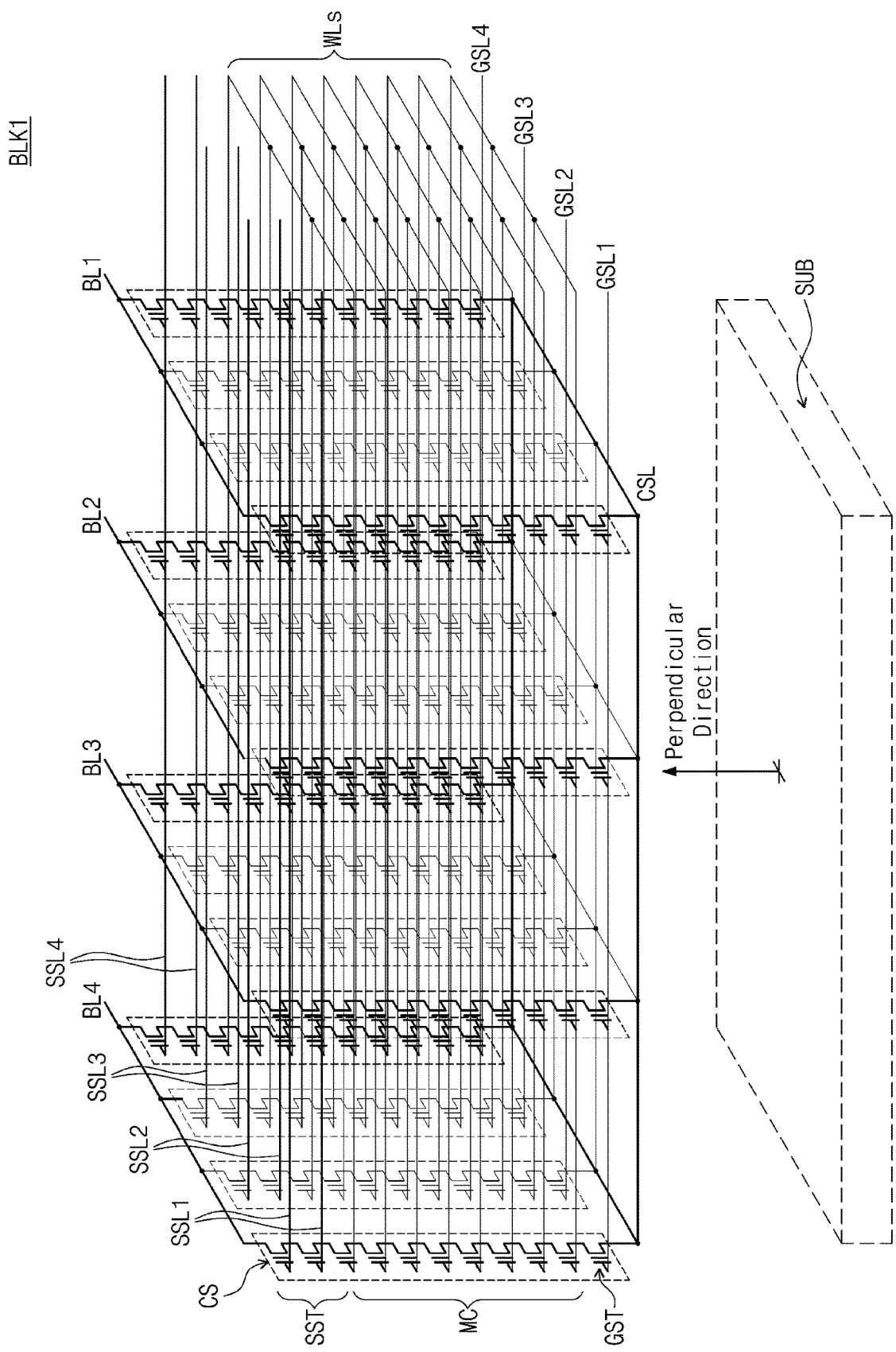
FIG. 6 is a circuit diagram of a memory block.

FIG. 6 is a circuit diagram of a memory block.

FIG. 6 is a diagram illustrating a structure of one memory block BLK1 illustrated in FIG. 5 in detail. Referring to FIG. 6, cell strings CS may be formed between bit lines BL1, BL2, BL3, and BL4 (at the top) and a common source line CSL (at the bottom) to constitute the memory block BLK1. Each of the cell strings CS may include a string selection transistor SST and a ground selection transistor GST. Memory cells MC may be included between the string selection transistor SST and the ground selection transistor GST included in each of the cell strings CS.

The string selection transistors SST may be respectively connected with the corresponding bit lines BL1, BL2, BL3, and BL4. Also, the string selection transistors SST may be connected with corresponding string selection lines SSL1, SSL2, SSL3, and SSL4. The ground selection transistors GST may be connected with the common source line CSL. Also, the ground selection transistors GST may be respectively connected with corresponding ground selection lines GSL1, GSL2, GSL3, and GSL4. The ground selection transistors GST may be controlled by the corresponding ground selection lines GSL1, GSL2, GSL3, and GSL4. The memory cells MC may be connected with word lines WL.

The circuit structure illustrated in FIG. 5 is only a structure simplified for convenience of description, and an actual memory block is not limited to the example illustrated in FIG. 5. That is, one memory block may include, for example, more semiconductor layers, more bit lines, and more string selection lines.

Figure 7:
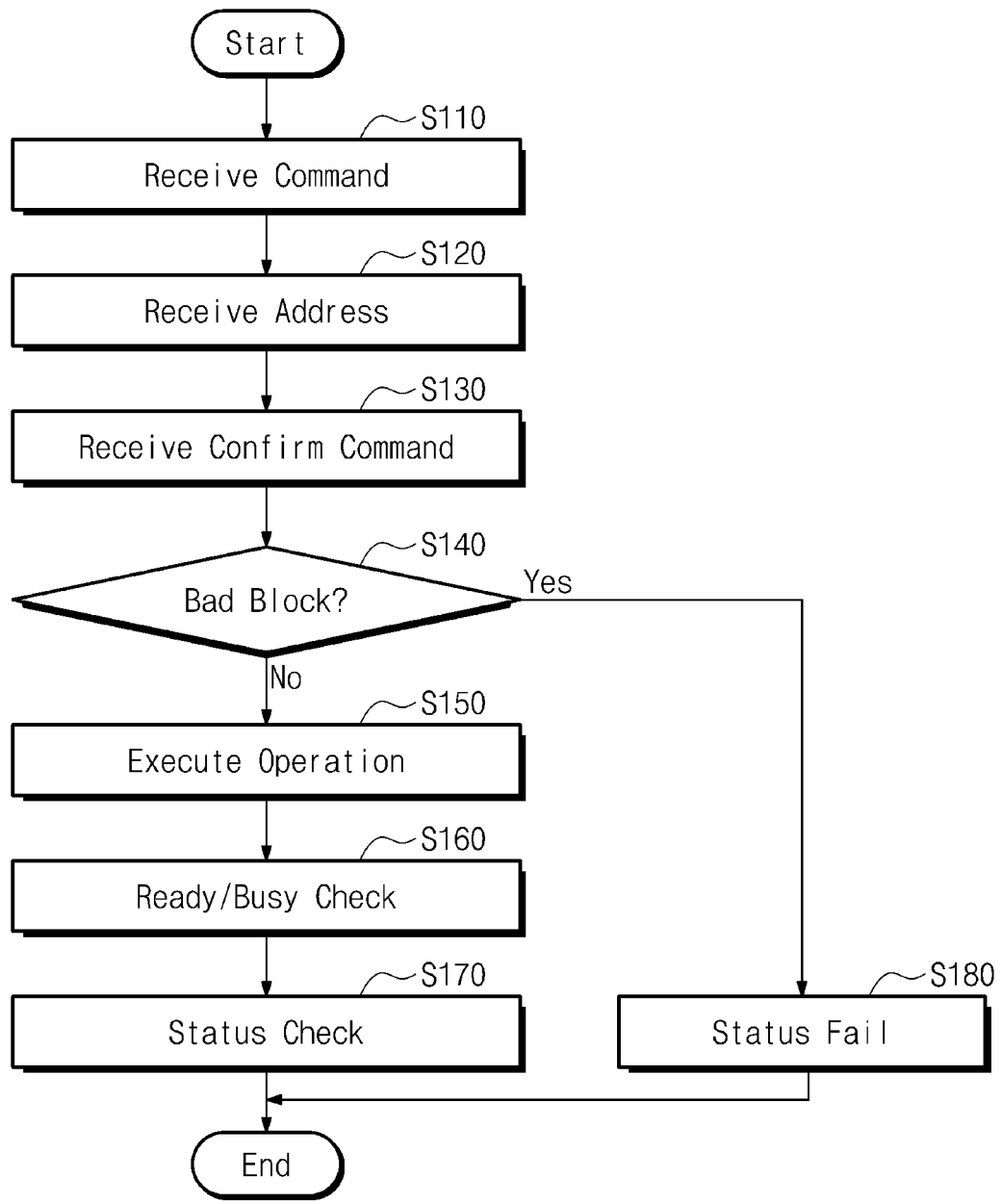
FIG. 7 is a flowchart illustrating a bad block processing method of a non-volatile memory device according to an embodiment of the present disclosure.

FIG. 7 is a flowchart illustrating a bad block processing method of a non-volatile memory device according to an embodiment of the present disclosure.

In operation S110, the non-volatile memory device 200 (refer to FIG. 1) may receive the command signal CMD from the outside. The command signal CMD may include any of a write command, a read command, or an erase command. When the command signal CMD is input to the non-volatile memory device 200, the command latch enable signal CLE may be activated. When the command latch enable signal CLE is activated and address information is input, the address latch enable signal ALE and the write latch enable signal /WE may also be activated.

In operation S120, the non-volatile memory device 200 may receive the address signal ADD from the outside. The address signal ADD may indicate an internal location of the non-volatile memory device 200, at which an operation corresponding to a command included in the command signal CMD received in operation S110 will be performed. The address signal ADD may be supplied when the address latch enable signal ALE is activated.

In operation S130, the non-volatile memory device 200 may receive a confirm command signal C_CMD from the outside. The confirm command signal C_CMD may include a command for checking whether a bad block exists, based on the address signal ADD received in operation S120.

In operation S140, the non-volatile memory device 200 may determine whether address information of the address signal ADD received from the outside coincides with bad block information stored in the bad block table 257 (refer to FIG. 3). When the address information coincides with the bad block information stored in the bad block table 257, the non-volatile memory device 200 may determine that a bad block is detected.

When a bad block is not detected in the non-volatile memory device 200, the procedure proceeds to operation S150. In operation S150, the non-volatile memory device 200 may perform an operation corresponding to the command included in the command signal CMD received from the outside with respect to a block that corresponds to the address information and is detected as not being a bad block.

In operation S160, the non-volatile memory device 200 may determine a ready/busy state of a normal block. The ready/busy state of the normal block may be determined based on the ready/busy signal R/B. How a ready/busy signal according to an embodiment of the present disclosure is generated will be more fully described with reference to FIG. 8A and FIG. 8B. Blocks included in the non-volatile memory device 200 may proceed to the subsequent operation(s) in a ready state.

In operation S170, the non-volatile memory device 200 may perform a status check for programming. The status check may be performed only on a block that is determined in operation S160 as being in a ready state. After the status check is performed on blocks of a ready state, the operation of the non-volatile memory device 200 for bad block detection is terminated.

When a bad block is detected in the non-volatile memory device 200, the procedure proceeds to operation S180. In operation S180, the non-volatile memory device 200 may determine the corresponding block as a status fail (i.e., that the block has a failure status) without executing a bad block erase loop to the full extent that the bad block erase loop is otherwise performed, e.g., up to a maximum value. The status fail means that it is impossible to program the corresponding block. After a status fail operation of a bad block is performed, the operation of the non-volatile memory device 200 for bad block detection is terminated without executing one or more of the intervals (e.g., all intervals) of the bad block erase loop.

Figure 8A:
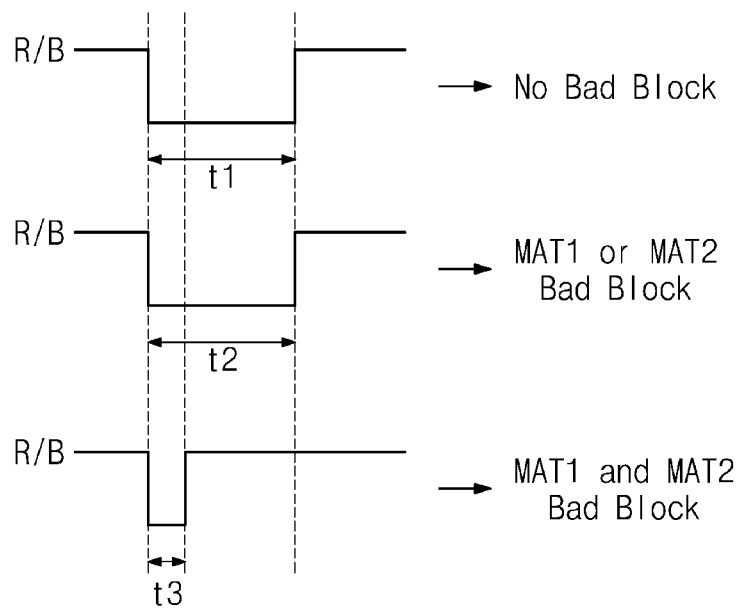
FIG. 8A is a diagram illustrating an aspect of generating the busy part of the ready/busy signal R/B when a bad block processing method is applied to a two-plane mode according to an embodiment of the present disclosure.

FIG. 8A is a diagram illustrating an aspect of generating the busy part of the ready/busy signal R/B when a bad block processing method is applied to a two-plane operation, according to an aspect of the present disclosure.

The aspect of generating the busy part of the ready/busy signal R/B illustrated in FIG. 8A is for the ready/busy signal R/B in the two-plane mode according to an embodiment of the present disclosure. A logical low interval of the ready/busy signal R/B illustrated in FIG. 8A is a busy time generation interval in bad block detection.

Conventionally, when a bad block occurs, a bad block erase loop may progress to a full extent of processing, i.e., up to a maximum value. In this case, an operation of a normal block may not be performed until the bad block erase loop ends. This may unnecessarily cause a loss of test time. However, the inventive concept(s) described herein may provide a memory device that is capable of reducing a test time loss according to a bad block erase loop by making a busy time of a bad block shorter than that of a normal block, when the bad block is detected.

Referring to FIG. 8A, in the case where a bad block does not occur (No Bad Block), that is, in the case where only normal blocks exist, a bad block erase loop may progress to the full extent, i.e., up to a maximum value. The subsequent operation(s) may not progress until the bad block erase loop ends. Accordingly, a busy time t1 may be maintained until the bad block erase loop ends. In the case where exactly one input address is associated with a bad block (MAT1 or MAT2 Bad Block), a busy time t2 may be equal to the busy time t1 corresponding to the case where a bad block does not occur (No Bad Block).

Moreover, in the case where both of the input addresses are associated with bad blocks (MAT1 and MAT2 Bad Block), the ready/busy signal R/B may have a busy time t3 that is shorter than the busy time t1 corresponding to the case where a bad block does not occur (No Bad Block) and the busy time t2 corresponding to the case where exactly one input address is associated with a bad block (MAT1 or MAT2 Bad Block). Accordingly, in the case where all the input addresses are associated with bad blocks (MAT1 and MAT2 Bad Block), the non-volatile memory device 200 according to an embodiment of the present disclosure may check only whether a bad block exists without executing a bad block erase loop to the full extent of processing, i.e., up to a maximum value. Resultingly, a time loss according to the bad block erase loop is erased.

In some embodiments, the busy time t2 when exactly one input address is associated with a bad block (MAT1 or MAT2 Bad Block) may be less than the busy time t1 corresponding to the case where a bad block does not occur (No Bad Block), and more than the busy time t3 when both of the input addresses are associated with bad blocks.

Figure 8B:
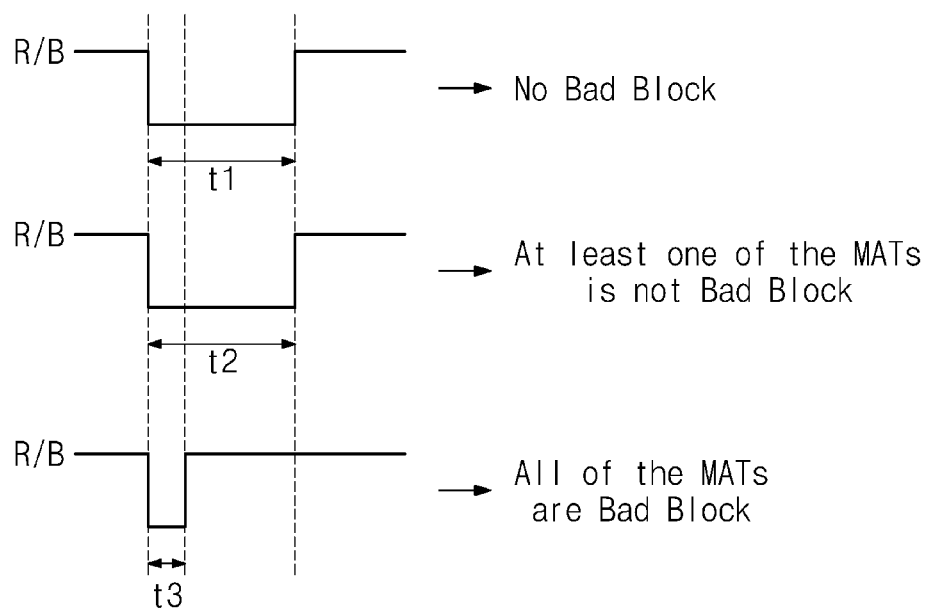
FIG. 8B is a diagram illustrating an aspect of generating the busy part of the ready/busy signal R/B when a bad block processing method is applied to a multi-plane mode according to an embodiment of the present disclosure.

FIG. 8B is a diagram illustrating an aspect of generating the busy part of the ready/busy signal R/B when a bad block processing method is applied to a multi-plane mode, according to an aspect of the present disclosure.

The aspect of generating the busy part of the ready/busy signal R/B illustrated in FIG. 8B is for the ready/busy signal R/B in the multi-plane mode according to an embodiment of the present disclosure. Like FIG. 8A, a logical low interval of the ready/busy signal R/B illustrated in FIG. 8B is a busy time generation interval in bad block detection.

Referring to FIG. 8B, in the case where a bad block does not occur (No Bad Block), that is, in the case where only normal blocks exist, a bad block erase loop may progress to the full extent, i.e., up to a maximum value. The subsequent operation(s) may not progress until the bad block erase loop ends. Accordingly, the busy time t1 may be maintained until the bad block erase loop ends. Also, in the case where at least one block of a multi-plane indicated by input addresses does not correspond to a bad block (e.g., at least one of the MATs is not a Bad Block), the busy time t2 may be equal to the busy time t1 corresponding to the case where a bad block does not occur (No Bad Block).

Moreover, in the case where all the blocks of the multi-plane indicated by input addresses are determined as bad blocks (e.g., all of the MATs are Bad Blocks), the ready/busy signal R/B may have the busy time t3 shorter than the busy time t1 corresponding to the case where a bad block does not occur (No Bad Block) and the busy time t2 corresponding to the case where at least one of the blocks of the multi-plane is determined as not corresponding to a bad block (e.g., at least one of the MATs is not a Bad Block). Accordingly, in the case where all the blocks indicated by input addresses included in the multi-plane are determined as bad blocks (e.g., all of the MATs are Bad Blocks), the non-volatile memory device 200 according to an embodiment of the present disclosure may reduce a time loss according to the bad block erase loop by checking only whether a bad block exists without executing a bad block erase loop to the full extent, i.e., up to a maximum value.

Figure 9:
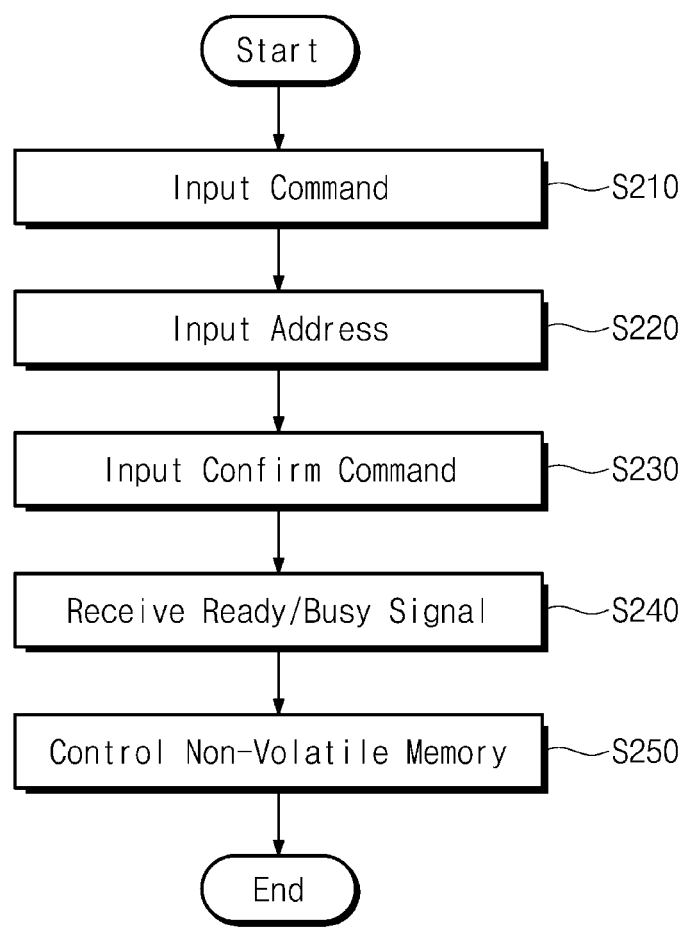
FIG. 9 is a flowchart illustrating an operating method of a test machine of FIG. 1.

FIG. 9 is a flowchart illustrating an operating method of a test machine of FIG. 1.

In operation S210, the test machine 100 (refer to FIG. 1) may input the command signal CMD to the non-volatile memory device 200 (refer to FIG. 1). The command signal CMD may include a command such as a write command, a read command, or an erase command. When the non-volatile memory device 200 receives the command signal CMD, the test machine 100 may activate the command latch enable signal CLE, the address latch enable signal ALE, and/or the write latch enable signal /WE.

In operation S220, the test machine 100 may input the address signal ADD to the non-volatile memory device 200. When the address latch enable signal ALE of the non-volatile memory device 200 is activated, the test machine 100 may supply the address signal ADD to be input to the non-volatile memory device 200. The address signal ADD may indicate an internal location of the non-volatile memory device 200 at which an operation will be performed, and the operation may correspond to the command in the command signal CMD received in operation S110.

In operation S230, the test machine 100 may input the confirm command signal C_CMD to the non-volatile memory device 200. The confirm command signal C_CMD may include a command for checking whether a bad block exists, based on the address signal ADD.

In operation S240, the test machine 100 may receive the ready/busy signal R/B that the non-volatile memory device 200 generates. The test machine 100 may obtain bad block information of the non-volatile memory device 200 based on the ready/busy signal R/B. The bad block information may include information about whether a bad block is present in the non-volatile memory device 200 and a location of a bad block.

In operation S250, the test machine 100 may control the non-volatile memory device 200 based on the bad block information obtained from the ready/busy signal R/B. After the test machine 100 determines whether a bad block is present in blocks included in the non-volatile memory device 200, the operation of the test machine 100 for bad block detection is terminated.

Figure 10A:
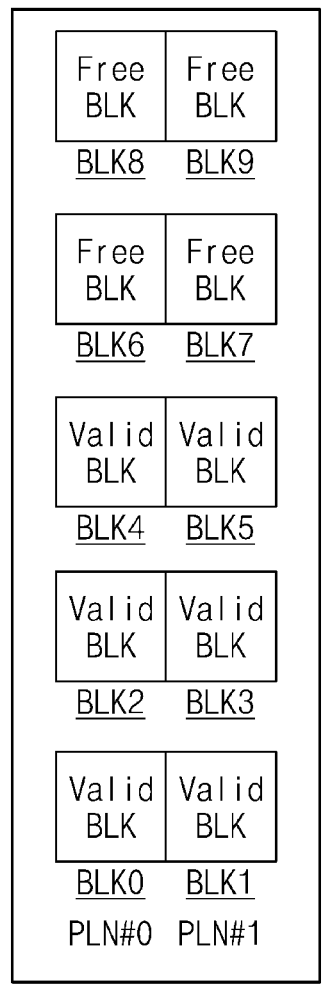
FIG. 10A is a diagram illustrating an operation in the case where a bad block does not occur in a two-plane mode, according to an embodiment of the present disclosure.

FIG. 10A is a diagram illustrating an operation in the case where a bad block does not occur in a two-plane mode, according to an embodiment of the present disclosure.

In FIG. 10A, a memory cell array 210c may include valid blocks BLK0, BLK1, BLK2, BLK3, BLK4, and BLK5 capable of storing user data. In the embodiment illustrated in FIG. 10A, the reserved block 212 (refer to FIG. 4) may not be used to replace a bad block. Instead, each reserved block 212 may be maintained as a free block (e.g., BLK6, BLK7, BLK8, and BLK9) in a state of being free.

Figure 10B:
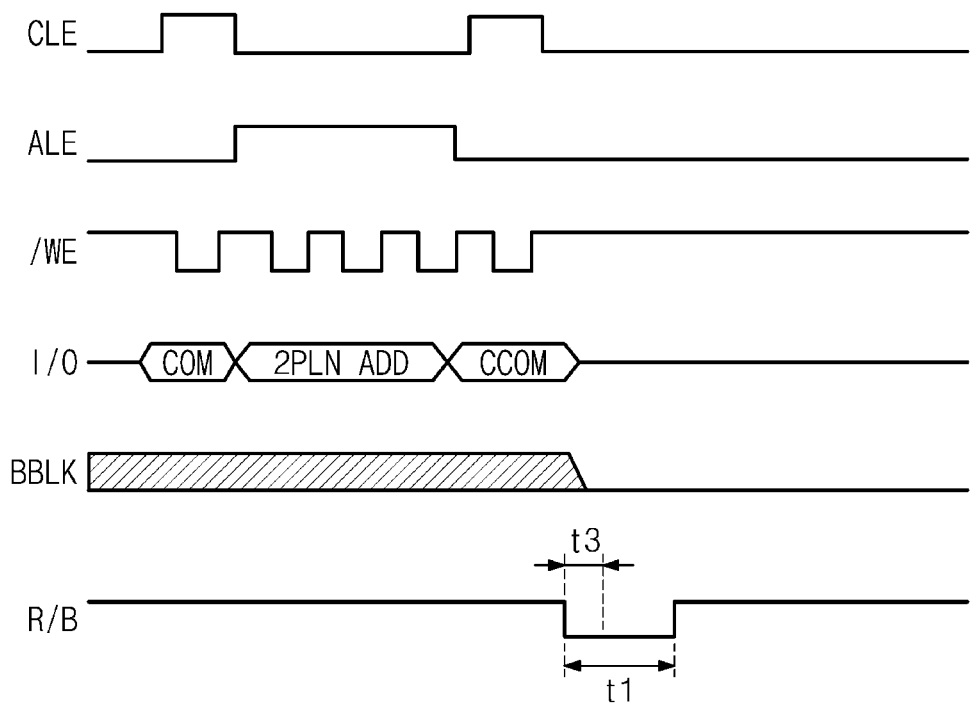
FIG. 10B is a timing diagram in the case where a bad block does not occur in a two-plane mode, according to an embodiment of the present disclosure.

FIG. 10B is a timing diagram in the case where a bad block does not occur in a two-plane mode, according to an embodiment of the present disclosure.

When the command signal CMD is input to the non-volatile memory device 200 (refer to FIG. 1) from the outside in the two-plane mode, the command latch enable signal CLE may be activated. When the command latch enable signal CLE is activated and address information is input, the address latch enable signal ALE and the write latch enable signal /WE may also be activated. When the address latch enable signal ALE is activated, two-plane mode bad block address information 2PLN ADD may be supplied.

The bad block table 257 (refer to FIG. 3) may generate the bad block flag signal BBLK based on the two-plane mode bad block address information 2PLN ADD thus supplied. The command latch enable signal CLE, the address latch enable signal ALE, and the write latch enable signal /WE that are activated may also be input to the memory chip control circuit 255 (refer to FIG. 5). The input signals that are input to the memory chip control circuit 255 may be output to the ready/busy controlling circuit 259 (refer to FIG. 3) through the memory chip control circuit 255. The ready/busy controlling circuit 259 may output the ready/busy-signal R/B based on the input signals.

In the case where a bad block does not occur as illustrated in FIG. 10B, the bad block flag signal BBLK of a logical low value may be generated. Thus, the busy time t1 may progress to the full extent, i.e., up to a maximum value of a bad block erase loop as in the case where a bad block does not occur (No Bad Block) (refer to FIG. 8A). That is, the busy time t1 may be maintained until the bad block erase loop ends.

Figure 11A:
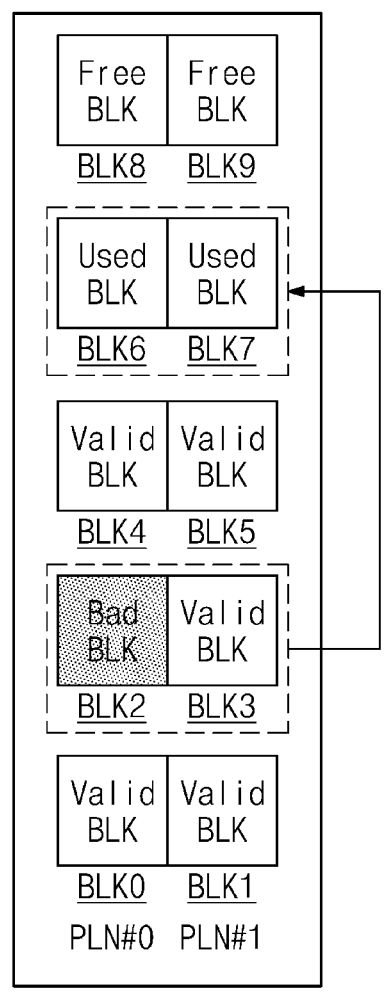
FIG. 11A is a diagram illustrating an operation in the case where a bad block occurs in at least one plane in a two-plane mode, according to an embodiment of the present disclosure.

FIG. 11A is a diagram illustrating an operation in the case where a bad block occurs in at least one plane in a two-plane mode, according to an embodiment of the present disclosure.

In FIG. 11A, a memory cell array 210d may include valid blocks BLK0, BLK1, BLK3, BLK4, and BLK5 capable of storing user data and one bad block BLK2. In the memory cell array 210d, the bad block BLK2 may be replaced with one block (e.g., BLK6) of the blocks belonging to the reserved block 212 (refer to FIG. 4). Also, even though the block BLK3 adjacent to the bad block BLK2 is a valid block, the block BLK3 may be replaced with one block (e.g., BLK7) of the blocks belonging to the reserved block 212 together with the bad block BLK2 for the purpose of improving reliability of a memory device.

Figure 11B:
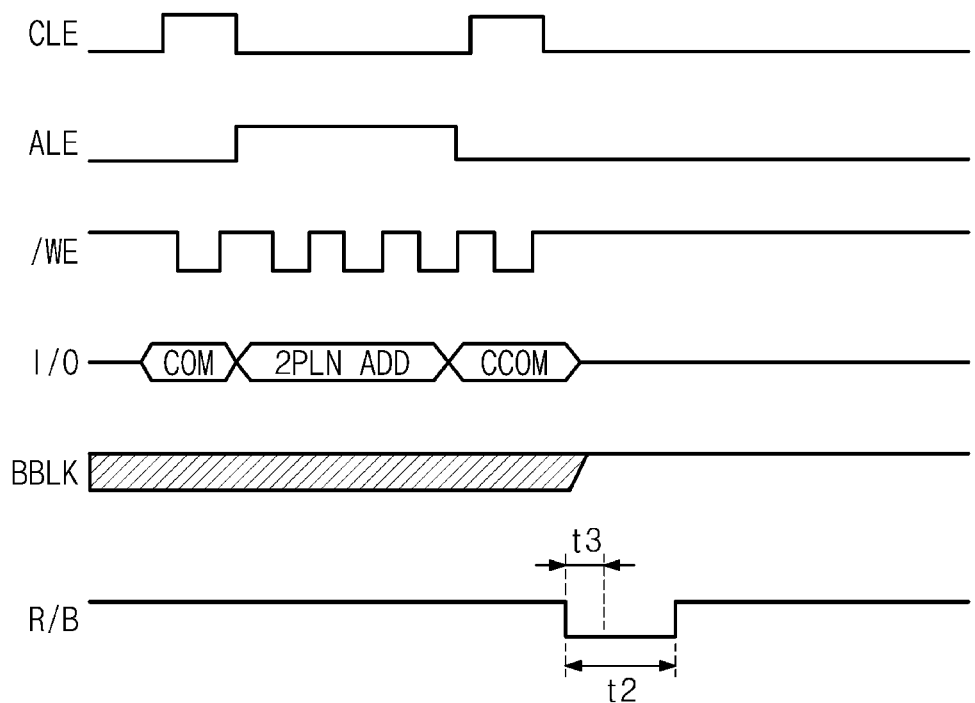
FIG. 11B is a timing diagram in the case where a bad block occurs in at least one plane in a two-plane mode, according to an embodiment of the present disclosure.

FIG. 11B is a timing diagram in the case where a bad block occurs in at least one plane in a two-plane mode, according to an embodiment of the present disclosure.

Even in the case where a bad block occurs in at least one plane, the non-volatile memory device 200 (refer to FIG. 1) according to an embodiment of the present disclosure may be supplied with the command signal CMD from the outside as in FIG. 10B. The command latch enable signal CLE, the address latch enable signal ALE, and the write latch enable signal /WE may be activated based on the command signal CMD. Also, when the address latch enable signal ALE is activated, the two-plane mode bad block address information 2PLN ADD may be supplied.

The bad block table 257 (refer to FIG. 3) may generate the bad block flag signal BBLK based on the two-plane mode bad block address information 2PLN ADD thus supplied. In the case of FIG. 11B, because a bad block occurs in at least one plane, the bad block flag signal BBLK of a logical high value may be generated. Accordingly, the busy time t2 may progress up to the full extent, i.e., up to a maximum value of a bad block erase loop as in the case where exactly one input address is associated with a bad block (MAT1 or MAT2 Bad Block) (refer to FIG. 8A). That is, the busy time t2 may be maintained until the bad block erase loop ends.

Figure 12A:
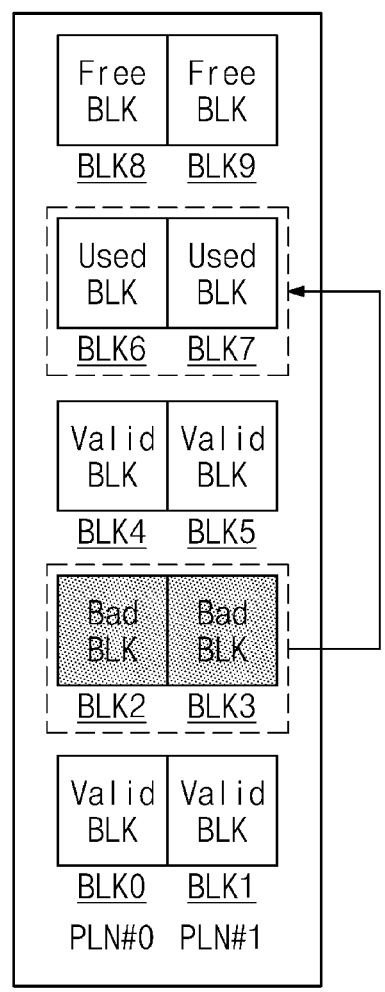
FIG. 12A is a diagram illustrating an operation in the case where bad blocks occur in all planes in a two-plane mode, according to an embodiment of the present disclosure.

FIG. 12A is a diagram illustrating an operation in the case where bad blocks occur in all planes in a two-plane mode, according to an embodiment of the present disclosure.

In FIG. 12A, a memory cell array 210e may include valid blocks BLK0, BLK1, BLK4, and BLK5 capable of storing user data and bad blocks BLK2 and BLK3. In the memory cell array 210e, the bad blocks BLK2 and BLK3 may be replaced with blocks BLK6 and BLK7 belonging to the reserved block 212 (refer to FIG. 4).

Figure 12B:
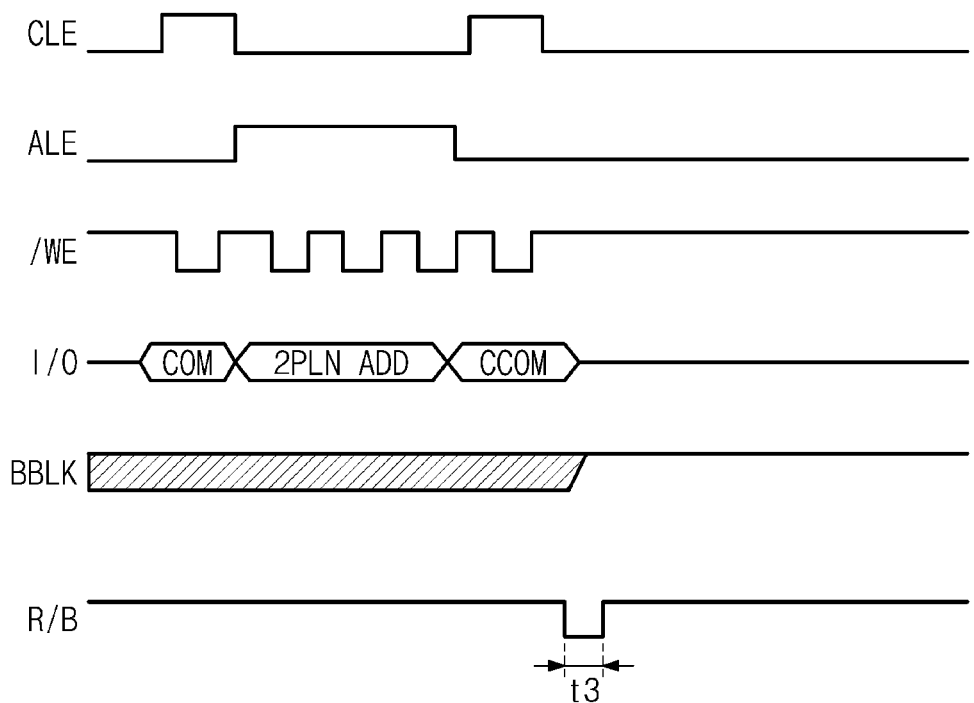
FIG. 12B is a timing diagram in the case where bad blocks occur in all planes in a two-plane mode, according to an embodiment of the present disclosure.

FIG. 12B is a timing diagram in the case where bad blocks occur in both planes in a two-plane mode, according to an embodiment of the present disclosure.

Even in the case where bad blocks occur in all planes operating in the two-plane mode, the non-volatile memory device 200 (refer to FIG. 1) according to an embodiment of the present disclosure may be supplied with the command signal CMD from the outside as in FIG. 10B. The command latch enable signal CLE, the address latch enable signal ALE, and the write latch enable signal /WE may be activated based on the command signal CMD. Also, when the address latch enable signal ALE is activated, the two-plane mode bad block address information 2PLN ADD may be supplied.

The bad block table 257 (refer to FIG. 3) may generate the bad block flag signal BBLK based on the two-plane mode bad block address information 2PLN ADD thus supplied. In the case of FIG. 12B, because bad blocks occur in both planes operating in the two-plane mode, the bad block flag signal BBLK of a logical high value may be generated. In this case, the busy time t3 may indicate that all input addresses are associated with bad blocks (MAT1 and MAT2 Bad Block) (refer to FIG. 8A).

That is, in the case where all the input addresses are associated with bad blocks (MAT1 and MAT2 Bad Block), the ready/busy signal RIB may have the busy time t3 shorter than the busy time t1 corresponding to the case where a bad block does not occur (No Bad Block) and the busy time t2 corresponding to the case where exactly one input address is associated with a bad block (MAT1 or MAT2 Bad Block). Also, in this case, the non-volatile memory device 200 according to an embodiment of the present disclosure may reduce a time loss according to the bad block erase loop by checking only whether a bad block exists without executing a bad block erase loop to the full extent, i.e., up to a maximum value.

FIG. 13A is a diagram illustrating an operation in the case where a bad block does not occur in a four-plane mode, according to another embodiment of the present disclosure.

In FIG. 13A, a memory cell array 210f may include valid blocks BLK0, BLK1, BLK2 . . . BLK11 capable of storing user data. In the embodiment illustrated in FIG. 13A, the reserved block 212 (refer to FIG. 4) may not be used to replace a bad block. That is, the reserved block 212 may be maintained as a free block (e.g., BLK12, BLK13 . . . BLK19) in a state of being free.

Figure 13B:
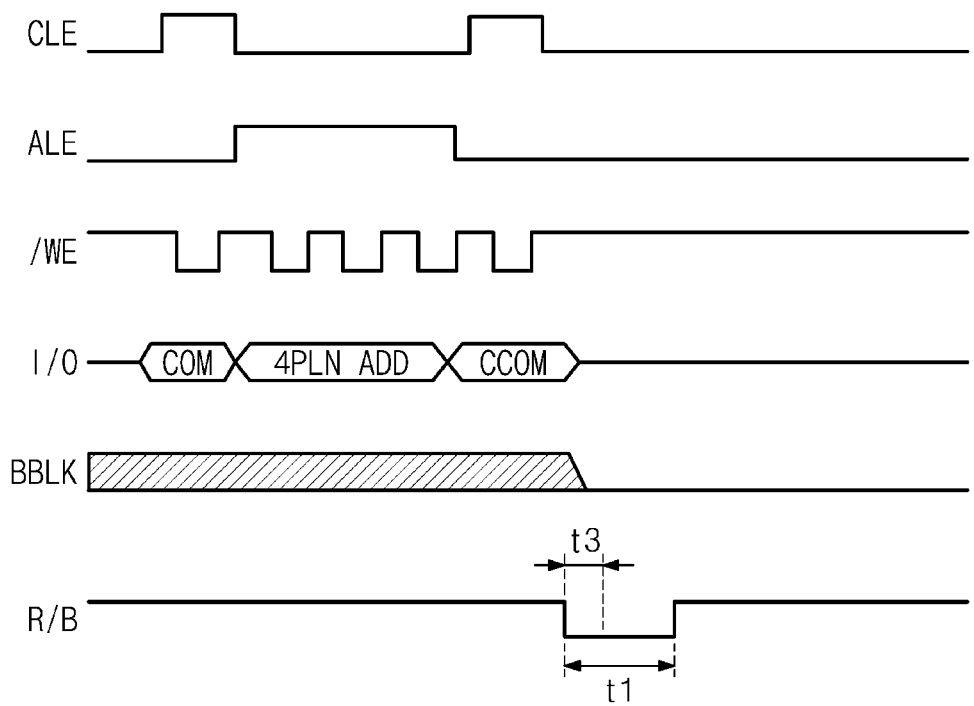
FIG. 13B is a timing diagram in the case where a bad block does not occur in a four-plane mode, according to another embodiment of the present disclosure.

FIG. 13B is a timing diagram in the case where a bad block does not occur in a four-plane mode, according to another embodiment of the present disclosure.

Even in the case of operating in the four-plane mode, the non-volatile memory device 200 (refer to FIG. 1) according to an embodiment of the present disclosure may be supplied with the command signal CMD from the outside as in FIG. 10B. The command latch enable signal CLE, the address latch enable signal ALE, and the write latch enable signal /WE may be activated based on the command signal CMD. Also, when the address latch enable signal ALE is activated, four-plane mode bad block address information 4PLN ADD may be supplied.

The bad block table 257 (refer to FIG. 3) may generate the bad block flag signal BBLK based on the four-plane mode bad block address information 4PLN ADD thus supplied. The command latch enable signal CLE, the address latch enable signal ALE, and the write latch enable signal /WE that are activated may also be input to the memory chip control circuit 255 (refer to FIG. 5). The input signals that are input to the memory chip control circuit 255 may be output to the ready/busy controlling circuit 259 (refer to FIG. 3) through the memory chip control circuit 255. The ready/busy controlling circuit 259 may output the ready/busy signal R/B based on the input signals.

In the case where a bad block does not occur as illustrated in FIG. 13B, the bad block flag signal BBLK of a logical low value may be generated, and thus, the busy time t1 may progress to the full extent, i.e., up to a maximum value of a bad block erase loop as in the case where a bad block does not occur (No Bad Block). That is, the busy time t1 may be maintained until the bad block erase loop ends.

Figure 14A:
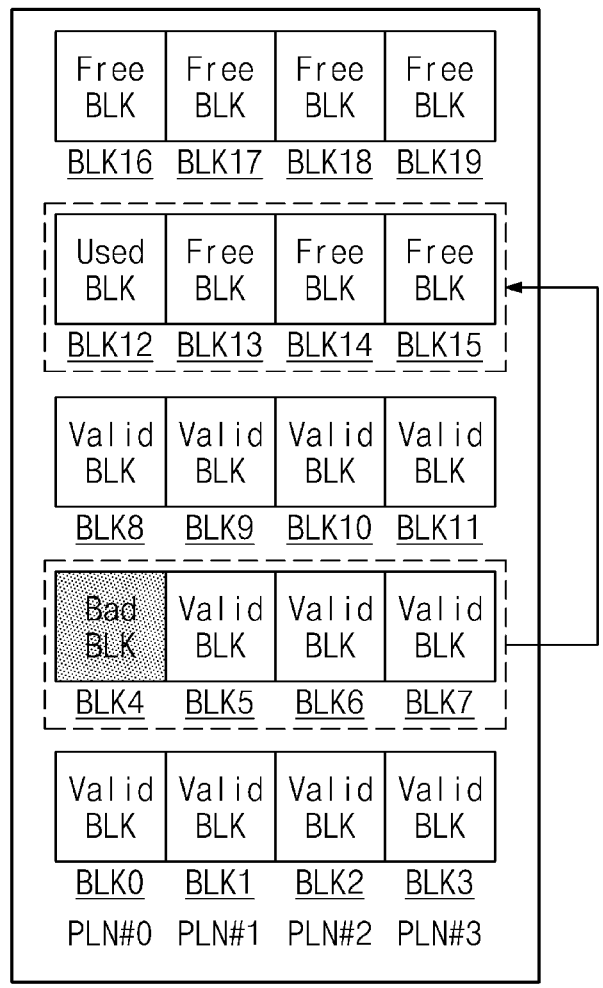
FIG. 14A is a diagram illustrating an operation in the case where a bad block occurs in at least one plane in a four-plane mode, according to another embodiment of the present disclosure.

FIG. 14A is a diagram illustrating an operation in the case where a bad block occurs in at least one plane in a four-plane mode, according to another embodiment of the present disclosure.

In detail, FIG. 14A is a diagram illustrating an operation when a bad block is detected from one (e.g., PLN#0) of four planes PLN#0 to PLN#3 operating in the four-plane mode. In FIG. 14A, a memory cell array 210g may include valid blocks BLK0, BLK1, BLK2, BLK3, BLK5, BLK6, BLK7, BLK8, BLK9, BLK10, and BLK11 capable of storing user data and one bad block BLK4. In the memory cell array 210g, the bad block BLK4 may be replaced with one block (e.g., BLK12) of blocks belonging to the reserved block 212 (refer to FIG. 4). Also, even though the blocks BLK5, BLK6, and BLK7 adjacent to the bad block BLK4 are valid blocks, the blocks BLK5, BLK6, and BLK7 may be replaced with blocks BLK13, BLK14, and BLK15 which are each a reserved block 212 together with the bad block BLK4 for the purpose of improving reliability of a memory device.

Figure 14B:
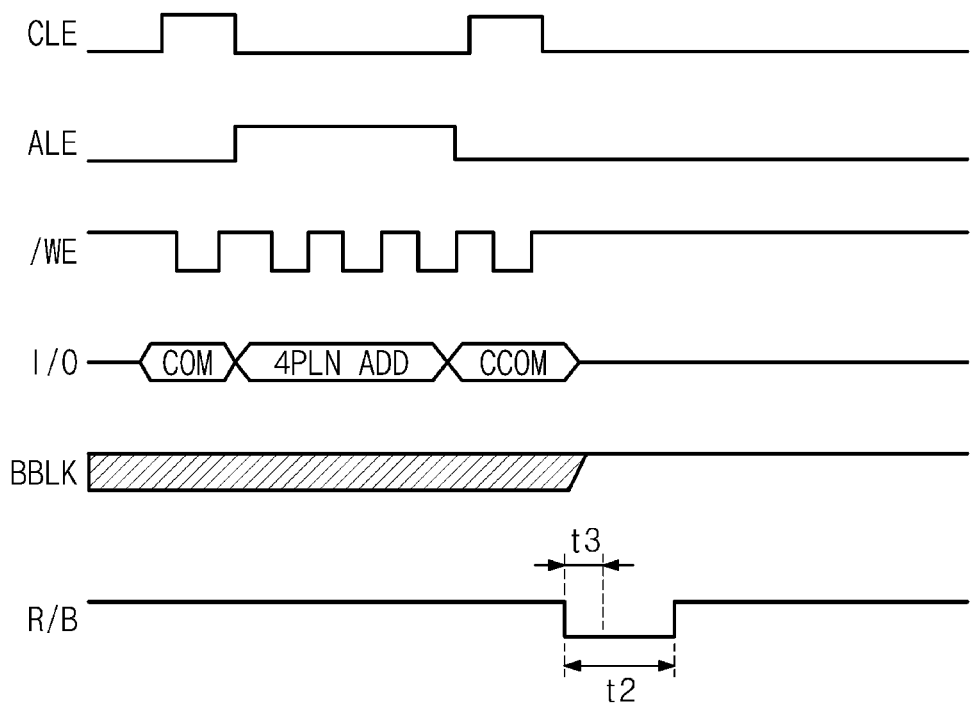
FIG. 14B is a timing diagram in the case where a bad block occurs in at least one plane in a four-plane mode, according to another embodiment of the present disclosure.

FIG. 14B is a timing diagram in the case where a bad block occurs in at least one plane in a four-plane mode, according to another embodiment of the present disclosure.

Even in the case where a bad block occurs in one of four planes operating in the four-plane mode, the non-volatile memory device 200 (refer to FIG. 1) according to an embodiment of the present disclosure may be supplied with the command signal CMD from the outside as in FIG. 10B. The command latch enable signal CLE, the address latch enable signal ALE, and the write latch enable signal /WE may be activated based on the command signal CMD. Also, when the address latch enable signal ALE is activated, the four-plane mode bad block address information 4PLN ADD may be supplied.

The bad block table 257 (refer to FIG. 3) may generate the bad block flag signal BBLK based on the four-plane mode bad block address information 4PLN ADD thus supplied. In the case of FIG. 14B, because a bad block occurs in one plane, the bad block flag signal BBLK of a logical high value may be generated. Accordingly, the busy time t2 may progress to the full extent, i.e., up to a maximum value of a bad block erase loop as in the case where at least one of multiple blocks does not correspond to a bad block (e.g., at least one of the MATs is not a Bad Block) (refer to FIG. 8B). That is, the busy time t2 may be maintained until the bad block erase loop ends.

Figure 15A:
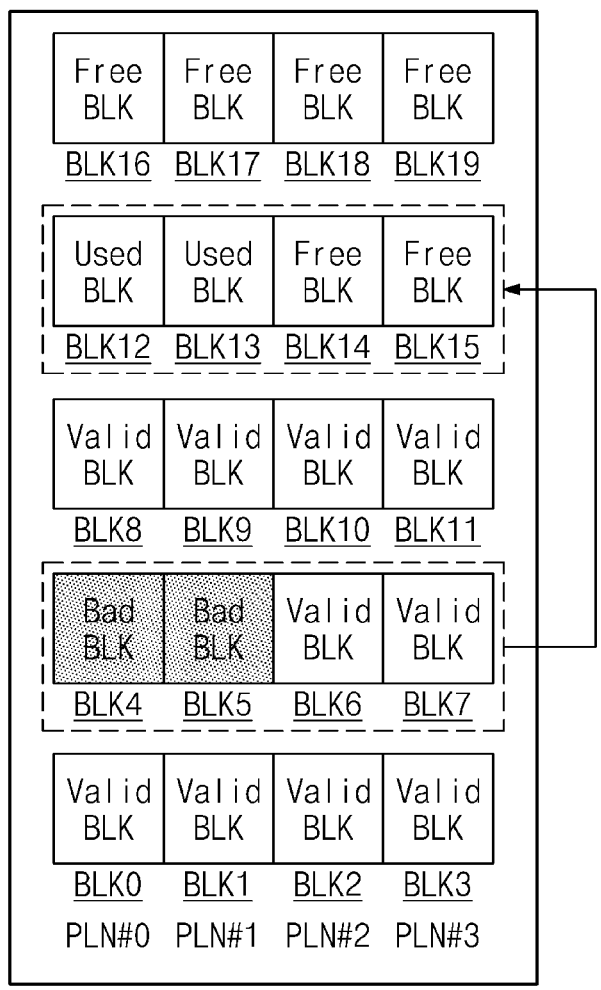
FIG. 15A is a diagram illustrating an operation in the case where bad blocks occur in some planes in a four-plane mode, according to another embodiment of the present disclosure.

FIG. 15A is a diagram illustrating an operation in the case where bad blocks occur in some planes in a four-plane mode, according to another embodiment of the inventive concept.

In detail, FIG. 15A is a diagram illustrating an operation when bad blocks are detected from two (e.g., PLN#0 and PLN#1) of four planes PLN#0 to PLN#3 operating in the four-plane mode. In FIG. 15A, a memory cell array 210h may include valid blocks BLK0, BLK1, BLK2, BLK5, BLK6, BLK7, BLK8, BLK9, BLK10, and BLK11 capable of storing user data and bad blocks BLK4 and BLK5. In the memory cell array 210h, the bad blocks BLK4 and BLK5 may be replaced with blocks BLK12 and BLK13 which are each a reserved block 212 (refer to FIG. 4). Also, even though the blocks BLK6 and BLK7 adjacent to the bad blocks BLK4 and BLK5 are valid blocks, the blocks BLK6 and BLK7 may be replaced with blocks BLK14 and BLK15 belonging to the reserved block 212 together with the bad blocks BLK4 and BLK5 for the purpose of improving reliability of a memory device.

Figure 15B:
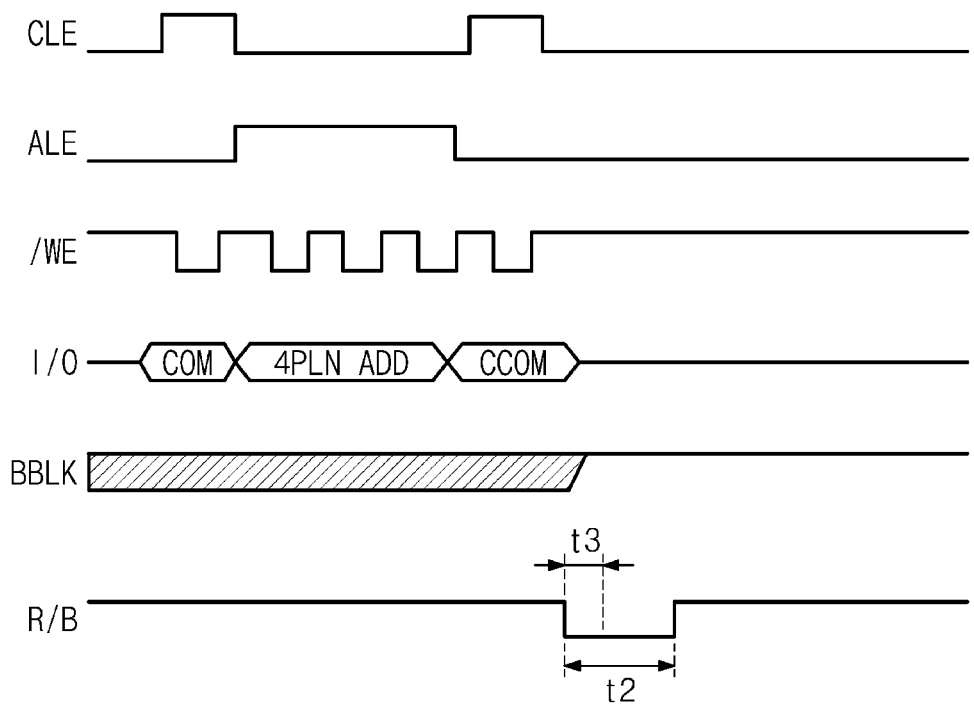
FIG. 15B is a timing diagram in the case where bad blocks occur in some planes in a four-plane mode, according to another embodiment of the present disclosure.

FIG. 15B is a timing diagram in the case where bad blocks occur in some planes in a four-plane mode, according to another embodiment of the present disclosure.

Even in the case where bad blocks occur in two of four planes operating in the four-plane mode, the non-volatile memory device 200 (refer to FIG. 1) according to an embodiment of the present disclosure may be supplied with the command signal CMD from the outside as in FIG. 10B. The command latch enable signal CLE, the address latch enable signal ALE, and the write latch enable signal /WE may be activated based on the command signal CMD. Also, when the address latch enable signal ALE is activated, the four-plane mode bad block address information 4PLN ADD may be supplied.

The bad block table 257 (refer to FIG. 3) may generate the bad block flag signal BBLK based on the four-plane mode bad block address information 4PLN ADD thus supplied. In the case of FIG. 15B, because bad blocks occur in two planes, the bad block flag signal BBLK of a logical high value may be generated. Accordingly, the busy time t2 may progress to the full extent, i.e., up to a maximum value of a bad block erase loop as in the case where at least one block does not correspond to a bad block (e.g., at least one of the MATs is not a Bad Block). That is, the busy time t2 may be maintained until the bad block erase loop ends.

Figure 16A:
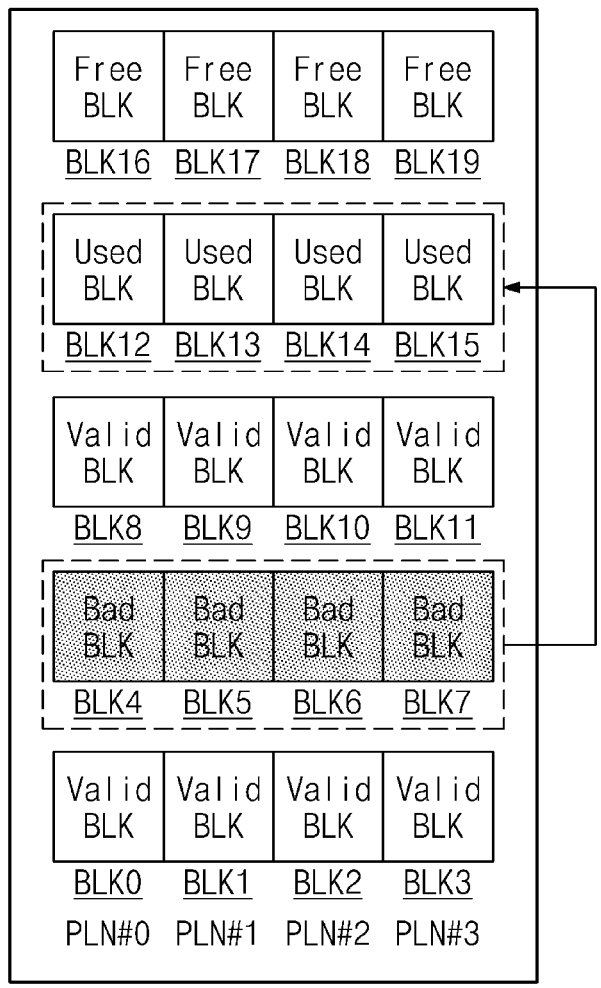
FIG. 16A is a diagram illustrating an operation in the case where bad blocks occur in all planes in a four-plane mode, according to another embodiment of the present disclosure.

FIG. 16A is a diagram illustrating an operation in the case where bad blocks occur in all planes in a four-plane mode, according to another embodiment of the present disclosure.

In FIG. 16A, a memory cell array 210i may include valid blocks BLK0, BLK1, BLK2, BLK3, BLK8, BLK9, BLK10, and BLK11 capable of storing user data and bad blocks BLK4, BLK5, BLK6, and BLK7. In the memory cell array 210i, the bad blocks BLK4, BLK5, BLK6, and BLK7 may be replaced with blocks BLK12, BLK13, BLK14, and BLK15 which are each a reserved block 212 (refer to FIG. 4).

Figure 16B:
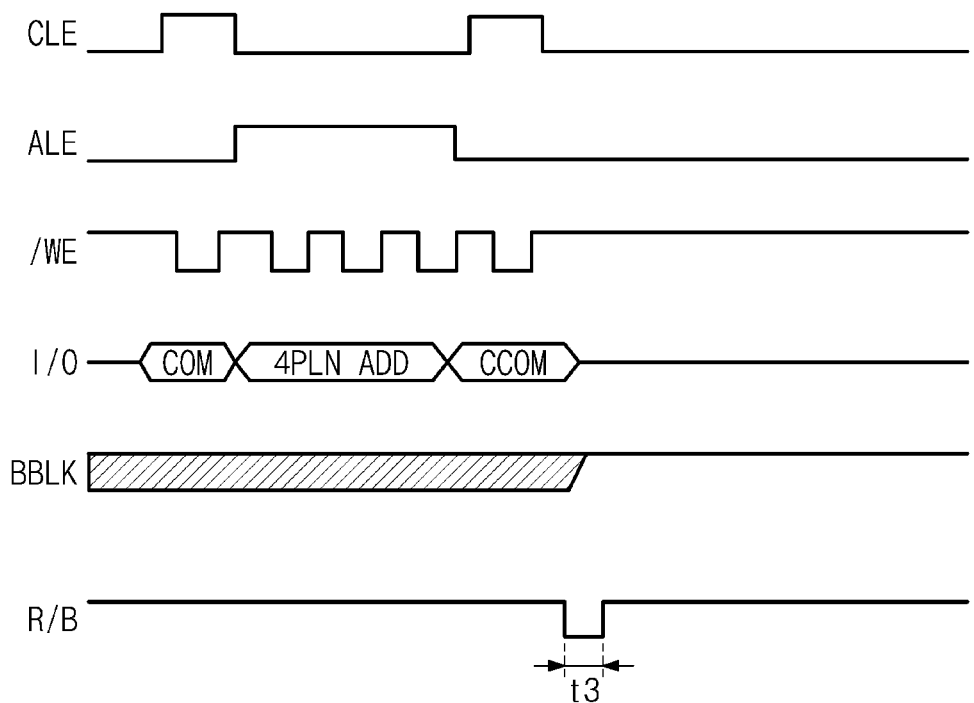
FIG. 16B is a timing diagram in the case where bad blocks occur in all planes in a four-plane mode, according to another embodiment of the present disclosure.

FIG. 16B is a timing diagram in the case where bad blocks occur in all planes in a four-plane mode, according to another embodiment of the present disclosure.

Even in the case where bad blocks occur in all planes, the non-volatile memory device 200 (refer to FIG. 1) according to an embodiment of the present disclosure may be supplied with the command signal CMD from the outside as in FIG. 10B. The command latch enable signal CLE, the address latch enable signal ALE, and the write latch enable signal /WE may be activated based on the command signal CMD. Also, when the address latch enable signal ALE is activated, the four-plane mode bad block address information 4PLN ADD may be supplied.

The bad block table 257 (refer to FIG. 3) may generate the bad block flag signal BBLK based on the four-plane mode bad block address information 4PLN ADD thus supplied. In the case of FIG. 16B, because bad blocks occur in all the planes, the bad block flag signal BBLK of a logical high value may be generated. In this case, the busy time t3 may indicate that all blocks are determined to be bad blocks (e.g., all of the MATs are Bad Blocks) (refer to FIG. 8B).

That is, in the case where all blocks are determined as a bad block (e.g., all of the MATs are Bad Blocks), the ready/busy signal R/B may have the busy time t3 shorter than the busy time t1 corresponding to the case where a bad block does not occur (No Bad Block) and the busy time t2 corresponding to the case where at least one of the blocks of the multi-plane is determined not to be a bad block (e.g., at least one of the MATs is not a Bad Block). Also, in this case, the non-volatile memory device 200 according to an embodiment of the present disclosure may reduce a time loss according to the bad block erase loop by checking only whether a bad block exists without executing a bad block erase loop to the full extent, i.e., up to a maximum value.

According to the inventive concept(s) described herein, a non-volatile memory device may reduce a time necessary for bad block detection by decreasing a busy time generation interval in the case where all blocks included in planes operating in a multi-plane mode are detected as a bad block.

While the inventive concept(s) described herein have been described with reference to exemplary embodiments thereof, it will be apparent to those of ordinary skill in the art that various changes and modifications may be made thereto without departing from the spirit and scope of the present disclosure as set forth in the following claims.

What is claimed is:

1. A test system, comprising:
    a non-volatile memory device including a plurality of memory blocks operating in a multi-plane mode; and
    a test machine configured to detect a bad block of the non-volatile memory device,
    wherein the non-volatile memory device generates a ready/busy signal which is based on whether an erase loop for detection of the bad block progresses,
    wherein, when at least one normal block is detected from a plurality of blocks included in planes operating in the multi-plane mode, the non-volatile memory device generates the ready/busy signal having a first busy interval, and
    wherein, when all the blocks included in the planes operating in the multi-plane mode are detected as bad blocks, the non-volatile memory device generates the ready/busy signal having a second busy interval shorter than the first busy interval.

2. The test system of claim 1, wherein the non-volatile memory device includes:
    an input/output buffer configured to exchange an input/output signal with an outside;
    a page buffer configured to exchange a data signal with the input/output buffer;
    a decoder configured to receive an address signal from the input/output buffer;
    a control logic circuit configured to receive a command signal from the input/output buffer; and
    a memory cell array connected with the page buffer through a bit line and connected with the decoder through a selection line and a word line.

3. The test system of claim 2, wherein the control logic circuit includes an input/output controlling circuit, a status register, an address register, a command register, a memory chip control circuit, a high voltage generator, a bad block table, a flag generator, and a ready/busy controlling circuit.

4. The test system of claim 3, wherein the memory chip control circuit receives a command latch enable signal, an address latch enable signal, and a write enable signal activated by the command signal.

5. The test system of claim 3, wherein the bad block table outputs a bad block flag signal to the flag generator.

6. The test system of claim 3, wherein the ready/busy controlling circuit includes an NMOS transistor having a source grounded and a drain connected with a ready/busy terminal and generates the ready/busy signal based on a bad block detection result of the non-volatile memory device.

7. The test system of claim 3, wherein a voltage of the high voltage generator is uniformly maintained in the first busy interval or the second busy interval.

8. The test system of claim 3, wherein a voltage of the non-volatile memory device is uniformly maintained in the first busy interval or the second busy interval.

9. The test system of claim 1, wherein the non-volatile memory device includes a memory cell array, and
wherein the memory cell array includes a user block, a reserved block, or a meta block.

10. The test system of claim 1, wherein the non-volatile memory device includes a NAND flash memory.

11. The test system of claim 1, wherein, when the ready/busy signal having the first busy interval is generated, the non-volatile memory device performs a status check for programming of the normal block, and
wherein, when the ready/busy signal having the second busy interval is generated, the non-volatile memory device determines the bad block as a status fail.

12. The test system of claim 1, wherein the multi-plane mode includes a two-plane mode or a four-plane mode.

13. The test system of claim 1, wherein each of the plurality of memory blocks includes a plurality of bit lines and a common source line,
wherein a plurality of cell strings are formed between the plurality of bit lines and the common source line,
wherein each of the plurality of cell strings includes a string selection transistor and a ground selection transistor, and
wherein memory cells are formed between the string selection transistor and the ground selection transistor.

14. The test system of claim 13, wherein the string selection transistor is connected with a corresponding bit line and is connected with a corresponding string selection line.

15. The test system of claim 13, wherein the ground selection transistor is connected with the common source line, is connected with a corresponding ground selection line, and is controlled by the corresponding ground selection line.

16. A bad block detection method of a non-volatile memory device which operates in a multi-plane mode, the method comprising:
receiving, at the non-volatile memory device, a command signal from an outside;
receiving, at the non-volatile memory device, an address signal from the outside;
receiving, at the non-volatile memory device, a confirm command signal from the outside;
detecting, at the non-volatile memory device, a bad block based on address information included in the address signal; and
generating, at the non-volatile memory device, a ready/busy signal which is based on whether an erase loop for detection of the bad block progresses,
wherein, when at least one normal block is detected from a plurality of blocks included in planes operating in the multi-plane mode, the non-volatile memory device generates the ready/busy signal having a first busy interval, and
wherein, when all the blocks included in the planes operating in the multi-plane mode are detected as bad blocks, the non-volatile memory device generates the ready/busy signal having a second busy interval shorter than the first busy interval.

17. The method of claim 16, wherein the non-volatile memory device receives a command latch enable signal, an address latch enable signal, and a write enable signal, which are activated based on the command signal.

18. The method of claim 16, wherein, in the detecting of the bad block, the non-volatile memory device determines that the bad block is detected when the address information corresponds to bad block information stored in a bad block table and determines that the bad block is not detected when the address information does not correspond to bad block information stored in a bad block table.

19. The method of claim 16, wherein, in the detecting of the bad block, when it is determined that a normal block is detected, the non-volatile memory device performs a status check for programming of the non-volatile memory device, and
wherein, in the detecting of the bad block, when it is determined that a bad block is detected, the non-volatile memory device determines the bad block as a status fail.

20. A bad block detection method of a non-volatile memory device which includes a plurality of memory blocks operating in a multi-plane mode, the method comprising:
inputting, at a test machine, a command signal to the non-volatile memory device;
inputting, at the test machine, an address signal for selecting a memory block of the plurality of memory blocks to the non-volatile memory device;
inputting, at the test machine, a confirm command signal to the non-volatile memory device;
detecting, at the test machine, a bad block based on address information included in the address signal;
receiving, at the test machine, a ready/busy signal which is based on whether an erase loop for detection of the bad block progresses,
wherein, when the ready/busy signal having a first busy interval is received, the test machine determines at least one of the plurality of memory blocks included in planes operating in the multi-plane mode as a normal block, and
wherein, when the ready/busy signal having a second busy interval shorter than the first busy interval is received, the test machine determines all the plurality of memory blocks included in the planes operating in the multi-plane mode as bad blocks.

* * * * *